United States Patent
Ma et al.

(10) Patent No.: US 7,514,119 B2
(45) Date of Patent: Apr. 7, 2009

(54) METHOD AND APPARATUS FOR USING SOLUTION BASED PRECURSORS FOR ATOMIC LAYER DEPOSITION

(75) Inventors: Ce Ma, Cary, NC (US); Qing Min Wang, Edison, NJ (US); Patrick J. Helly, Valley Center, CA (US); Richard Hogle, Oceanside, CA (US)

(73) Assignee: Linde, Inc., Murray Hill, NJ (US)

( * ) Notice: Subject to any disclaimer, the term of this patent is extended or adjusted under 35 U.S.C. 154(b) by 78 days.

(21) Appl. No.: 11/400,904

(22) Filed: Apr. 10, 2006

(65) Prior Publication Data

US 2006/0269667 A1    Nov. 30, 2006

Related U.S. Application Data

(60) Provisional application No. 60/676,491, filed on Apr. 29, 2005.

(51) Int. Cl.
*C23C 16/00* (2006.01)
(52) U.S. Cl. .............. 427/255.31; 427/255.28; 427/255.25
(58) Field of Classification Search .......... 427/248.1, 427/255.23, 255.25, 255.31
See application file for complete search history.

(56) References Cited

U.S. PATENT DOCUMENTS 6,664,186 B1    12/2003    Callegari et al.

2004/0043149 A1    3/2004    Gordon et al.
2004/0215029 A1*   10/2004   Takamori et al. ............ 556/136

OTHER PUBLICATIONS

Potter et al., "Deposition of HfO2, Gd2O3 and PrOx by Liquid Injection ALD Techniques", Chemical Vapor Deposition, vol. 11, No. 3, Mar. 2005, pp. 159-169, Wiley-VCH Verlag GmbH & Co. KGaA., Weinheim.*
Extended European Search Report dated Nov. 12, 2007, with Annex, 12 pages.
Beach et al., "MOCVD of Very Thin Films of Lead Lanthanum Titanate", Mat. Res. Soc. Symp. Proc. vol. 415, 1996, pp. 225-230, Materials Research Society.
Potter et al., "Deposition of HfO2, Gd2O3 and PrOx by Liquid Injection ALD Techniques", Chemical Vapor Deposition, vol. 11, No. 3, 2005, pp. 159-169, Wiley-VCH Verlag GmbH & Co. KGaA., Weinheim.

* cited by examiner

*Primary Examiner*—Timothy H Meeks
*Assistant Examiner*—David Turocy
(74) *Attorney, Agent, or Firm*—David A. Hey

(57) ABSTRACT

A unique combination of solution stabilization and delivery technologies with special ALD operation is provided. A wide range of low volatility solid ALD precursors dissolved in solvents are used. Unstable solutes may be stabilized in solution and all of the solutions may be delivered at room temperature. After the solutions are vaporized, the vapor phase precursors and solvents are pulsed into a deposition chamber to assure true ALD film growth.

1 Claim, 8 Drawing Sheets

METHOD AND APPARATUS FOR USING SOLUTION BASED PRECURSORS FOR ATOMIC LAYER DEPOSITION

FIELD OF THE INVENTION

The present invention relates to new and useful methods and apparatus for delivery of a broader class of precursors for atomic layer deposition. The present invention also relates to atomic layer deposition methods utilizing a new method of delivering precursors.

BACKGROUND OF THE INVENTION

Atomic layer deposition (ALD) is an enabling technology for next generation conductor barrier layers, high-k gate dielectric layers, high-k capacitance layers, capping layers, and metallic gate electrodes in silicon wafer processes. ALD has also been applied in other electronics industries, such as flat panel display, compound semiconductor, magnetic and optical storage, solar cell, nanotechnology and nanomaterials. ALD is used to build ultra thin and highly conformal layers of metal, oxide, nitride, and others one monolayer at a time in a cyclic deposition process. Oxides and nitrides of many main group metal elements and transition metal elements, such as aluminum, titanium, zirconium, hafnium, and tantalum, have been produced by ALD processes using oxidation or nitridation reactions. Pure metallic layers, such as Ru, Cu, Ta, and others may also be deposited using ALD processes through reduction or combustion reactions.

A typical ALD process uses sequential precursor gas pulses to deposit a film one layer at a time. In particular, a first precursor gas is introduced into a process chamber and produces a monolayer by reaction at surface of a substrate in the chamber. A second precursor is then introduced to react with the first precursor and form a monolayer of film made up of components of both the first precursor and second precursor, on the substrate. Each pair of pulses (one cycle) produces exactly one monolayer of film allowing for very accurate control of the final film thickness based on the number of deposition cycles performed.

As semiconductor devices continue to get more densely packed with devices, channel lengths also have to be made smaller and smaller. For future electronic device technologies, it will be necessary to replace $SiO_2$ and SiON gate dielectrics with ultra thin high-k oxides having effective oxide thickness (EOT) less than 1.5 nm. Preferably, high-k materials should have high band gaps and band offsets, high k values, good stability on silicon, minimal $SiO_2$ interface layer, and high quality interfaces on substrates. Amorphous or high crystalline temperature films are also desirable. Some acceptable high-k dielectric materials are listed in Table 1. Among those listed, $HfO_2$, $Al_2O_3$, $ZrO_2$, and the related ternary high-k materials have received the most attention for use as gate dielectrics. $HfO_2$ and $ZrO_2$ have higher k values but they also have lower break down fields and crystalline temperatures. The aluminates of Hf and Zr possess the combined benefits of higher k values and higher break down fields. $Y_2O_3$ has high solubility of rare earth materials (e.g. $Eu^{+3}$) and is useful in optical electronics applications.

TABLE 1

Dielectric properties of ALD high-k gate materials

| Material | K | EOT (@ 5 nm film) | Break down Field $E_{BD}$ (MV/cm @ 1 $\mu$A/cm$^2$) | Crystalline Temp (° C.) |
|---|---|---|---|---|
| $HfO_2$ | 13-17 | 1.3 | 1-5 | 400-600 |
| $Al_2O_3$ | 7-9 | 2.44 | 3-8 | 900-1000 |
| $ZrO_2$ | 20 | 0.98 | 1 | <300 * |
| $Hf_xAl_yO_z$ | 8-20 | 1.22 | N/A | 900 |
| $Zr_xAl_yO_z$ | 8-20 | 1.22 | N/A | 975 |
| $Y_2O_3$ | 12-15 | 1.44 | 4 | <600 |
| $Ta_2O_5$ | 23-25 | 0.81 | 0.5-1.5 | 500-700 |
| $Nb_xAl_yO_z$ | 8 | 2.44 | 5 | N/A |
| $Hf_xSi_yO_z$ | N/A | N/A | N/A | 800 |
| $Ta_xTi_yO_z$ | 27-28 | 0.71 | 1 | N/A |
| $Al_2O_3/HfO_2$ | N/A | N/A | N/A | N/A |
| $Al_2O_3/TiO_2$ | 9-18 | 1.44 | 5-7 | N/A |

* as a function of film thickness

Transition metals and metal nitrides may be used as diffusion barriers to prevent inter-diffusion of metal and silicon in IC devices. These barrier layers are only a few nm in thickness, and are conformal in trenches and vias. Table 2 shows some properties of ALD grown barriers. Desirable properties include low growth temperature (<400° C.) and low film resistivity. For example, Ta/TaN and W/W×N are preferred as copper diffusion barrier systems. ALD metal thin layers, such as Ru, Cu, Pt, and Ta, have also been deposited for use as barrier and seed layer applications.

TABLE 2

Film properties of ALD nitride barrier layer materials

| Film | Metal precursor | Other precursors | Growth Temp (° C.) | Resistivity ($\mu\Omega$*cm) |
|---|---|---|---|---|
| TaN | $TaCl_5$ | $Zn + NH_3$ | 400-500 | 900 |
| TaN | $TaCl_5$ | H/N plasma | 300-400 | 300-400 |
| TaN(C) | TBTDET | $NH_3$ | 250 | N/A |
| TaN(C) | TBTDET | H plasma | N/A | 250 |
| $TaN_x$ | $TaF_5$ | H/N plasma | 250 | $10^4$-$10^3$ |
| $Ta_3N_5$ | $TaCl_5$ | $NH_3$ | 400-500 | $10^5$-$10^4$ |
| $W_2N$ | $WF_6$ | $NH_3$ | 330-530 | 4500 |
| TiN | $TiCl_4$ | $NH_3$ | 500 | 250 |
| TiN | $TiCl_4$ | $Zn + NH_3$ | 500 | 50 |
| TiN | $TiI_4$ | $NH_3$ | 400-500 | 380-70 |
| TiN | $TiCl_4$ | $Me_2NNH_2$ | 350 | 500 |
| TiN | TEMAT | $NH_3$ | 160-320 | 600 (post annealed) |
| TiN | $Ti(NMe_2)_4$ | $NH_3$ | 180 | 5000 |

ALD is an advanced deposition method for high density memory devices when highly conformal and high aspect ratio deposition of high-k dielectric materials and its liners is needed. High-k oxides listed in Table 1, such as $Al_2O_3$, as well as ferroelectric materials, such as BST, PZT, and SBT layers, have been used as capacitor dielectrics in memory devices.

Several types of traditional vapor phase deposition precursors have been tested in ALD processes, including halides, alkoxides, β-diketonates, and newer alkylamides and cyclopentadienyls materials. Halides perform well in ALD processes with good self-limiting growth behaviors, but are mostly high melting solids that require high source temperatures. Another disadvantage of using solid precursors is the risk of particle contamination to the substrate. In addition, there is an issue of instability in flux or dosage associated with the solid precursors. Alkoxides show reduced deposition temperatures in ALD processes, but can decompose in the vapor phase leading to a continuous growth process instead of ALD. β-diketonates are used in MOCVD processes and are generally more stable towards hydrolysis than alkoxides. However, they are less volatile and require high source and substrate temperatures. A mixed ligand approach with β-diketonates and alkoxides has been suggested to improve stability of alkoxide MOCVD precursors. Examples are $Zr(acac)_2(hfip)_2$, $Zr(O-t-Pr)_2(thd)_2$. In addition, metal nitrate precursors, $M(NO_3)_x$, alkylamides, and amidinates, show self-limiting growth behavior with very low carbon or halide contamination. However, the stability of nitrates and amides is an issue in production and many cyclopentadienyls are in solid forms.

In general, ALD precursors should have good volatility and be able to saturate the substrate surface quickly through chemisorptions and surface reactions. The ALD half reaction cycles should be completed within 5 seconds, preferably within 1 second. The exposure dosage should be below $10^8$ Laugmuir (1 Torr*sec=$10^6$ Laugmuir). The precursors should be stable within the deposition temperature windows, because un-controllable CVD reactions could occur when the precursor decomposes in gas phase. The precursors themselves should also be highly reactive so that the surface reactions are fast and complete. In addition, complete reactions yield good purity in films. The preferred properties of ALD precursors are given in Table 3.

TABLE 3

Preferred ALD precursor properties

| Requirement Class | Property | Range |
|---|---|---|
| Primary | Good volatility | >0.1 Torr |
| Primary | Liquid or gas | At room temperatures |
| Primary | Good thermal stability | >250° C. or >350° C. in gas phase |
| Primary | Fast saturation | <5 sec or <1 sec |
| Primary | Highly reactive | Complete surface reactive cycles |
| Primary | Non reactive volatile byproduct | No product and reagent reaction |
| Secondary | High growth rate | Up to a monolayer a cycle |
| Secondary | Less shield effect from ligands | Free up un-occupied sites |
| Secondary | Cost and purity | Key impurity: $H_2O$, $O_2$ |
| Secondary | Shelf-life | >1-2 years |
| Secondary | Halides | Free in films |
| Secondary | Carbon | <1% in non carbon containing films |

Because of stringent requirements for ALD precursors as noted in Table 3, new types of ALD precursors are needed that are more stable, exhibit higher volatility, and are better suited for ALD. However, the cost of developing new precursors is a significant obstacle. In this light, the prior art related to chemical vapor deposition (CVD) processes provides some useful background information.

Direct liquid injection methods have been used in many vapor phase deposition processes. For example, U.S. Pat. No. 5,376,409 describes a method of delivering solid precursors that have been dissolved in an appropriate solvent for use in chemical vapor deposition (CVD) techniques. U.S. Pat. No. 5,451,260 describes a method for providing a liquid precursor solution for direct injection using an ultrasonic nozzle for CVD techniques. Beach, et al., in "MOCVD of very thin films of lead lanthanum titanate", MRS symposium proceedings, 415, 225-30 (1996) set forth a CVD method using multiple precursors dissolved in a single solution. Choi, et al., "Structure stability of metallorganic chemical vapor deposited (Ba, Sr)$RuO_3$ electrodes for integration of high dielectric constant thin films", Journal of the Electrochemical Society, 149(4), G232-5 (2002), describes a CVD method using liquid injection of a multiple component solution. Zhao, et al., "Metallorganic CVD of high-quality PZT thin films at low temperature with new Zr and Ti precursors having mmp ligands", Journal of the Electrochemical Society, 151(5), C283-91 (2004) discusses another CVD method using a multiple precursor solution liquid delivery system. As noted, each of these references discuss CVD techniques and are interesting only for the discussion of various precursor materials, including solid precursors dissolved in appropriate solvents.

There is also some prior art background material relating to ALD processes. Cho, et al., "Atomic layer deposition (ALD) of Bismuth Titanium oxide thin films using direct liquid injection (DLI) method", Integrated Ferroelectrics, 59, 1483-9, (2003), reports on the use of solid precursors dissolved in a solvent. However, no information is provided concerning the delivery and deposition methods.

US published patent application 2003/0056728 discloses a pulsed liquid injection method in an atomic vapor deposition (AVD) process, using a precursor in liquid or dissolved form. The liquid dose is too large for ideal ALD operation. Min, et al., "Atomic layer deposition of $Al_2O_3$ thin films from a 1-methoxy-2-methyl-2-propoxide complex of aluminum and water", Chemistry Materials (to be published in 2005), describes a liquid pulsing method for solution precursors, where again the liquid dose is too large for ideal ALD operation. In fact, using liquid pulse to achieve monolayer coverage is very difficult, because in an ALD operation, the pulse width of a vapor phase reactant is 1 second or less. One issue is that the shape of a vaporized liquid pulse is distorted in time space and sharp leading and tailing edges of the liquid pulse can be lost after vaporization. It is therefore difficult to synchronize two well separated reactants to perform self-limiting and sequential ALD growth. The liquid pulse methods described in the two references above do not represent true ALD processes but rather variants of CVD processes.

US published patent application 2004/0079286, describes a two-phase delivery system for ALD wherein both vapor and liquid phase coexist in a vaporizer after liquid injection. This process will not work for solution based precursors or multicomponent mixtures where material separation would occur.

There remains a need in the art for improvements to ALD precursors and methods of using such precursors in ALD processes.

SUMMARY OF INVENTION

The present invention provides unique combinations of solution stabilization and delivery technologies with special ALD operational modes. In particular, the present invention allows the use of low-volatility solid ALD precursors dissolved in solvents. The low-volatility solid precursors are often less expensive and often exhibit very high boiling points. Further, unstable solutes can be stabilized in solution and still retain very high boiling points. This is advantageous because the solutions may be delivered at room temperature. After the solution is vaporized, the vapor-phase mixture of precursor and solvent is pulsed into a deposition chamber to assure a true ALD process. The present invention also covers a delivery apparatus that achieves the above result.

DETAILED DESCRIPTION OF THE INVENTION

Figure 1:
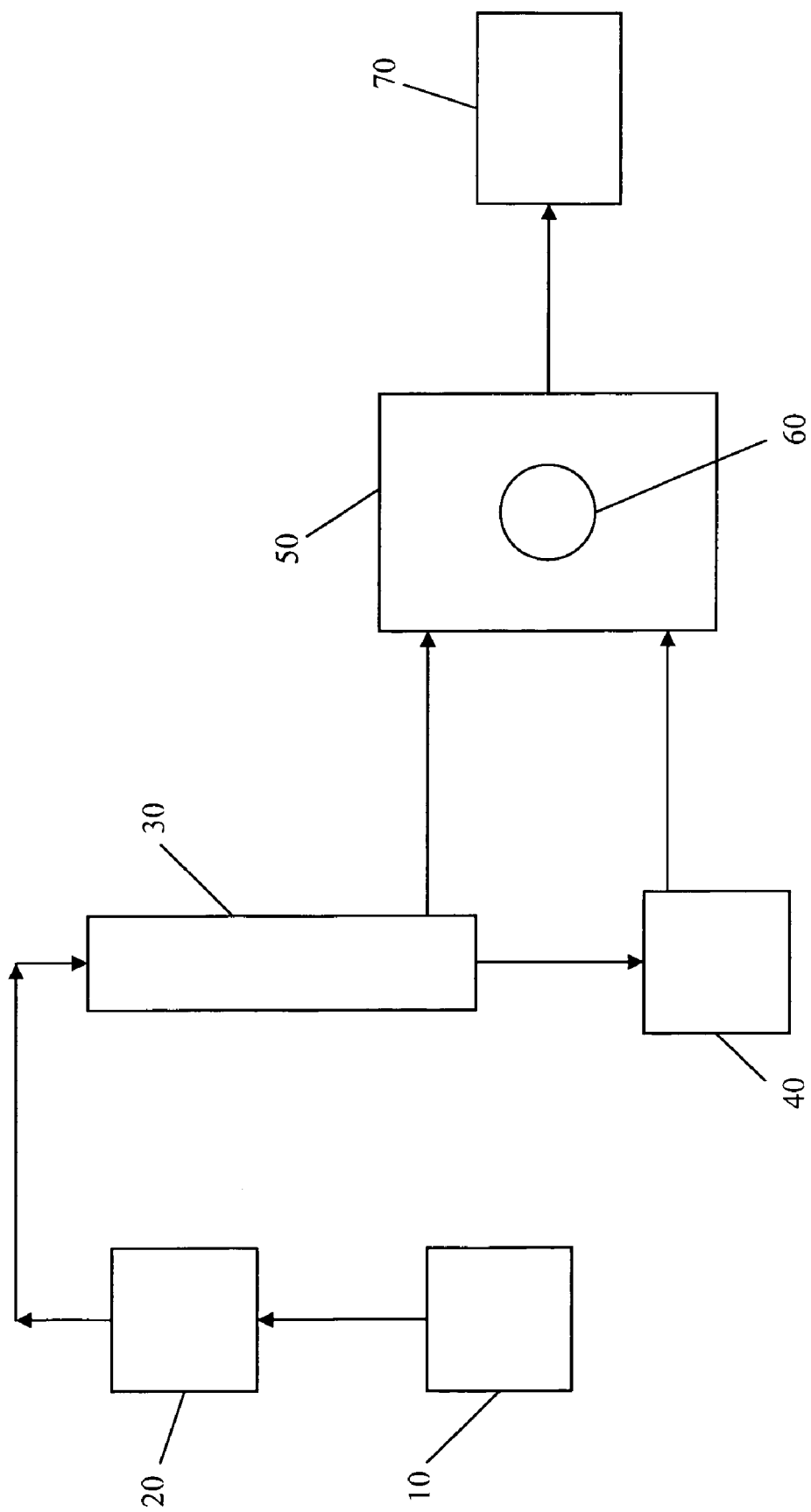
FIG. 1 is a schematic diagram of an ALD apparatus used to deliver precursors according to one embodiment of the present invention.

Stable ALD precursor solutions are prepared in suitable solvents. The precursor solute can be selected from a wide range of low vapor pressure solutes or solids depending upon specific applications. Precursor concentrations are generally maintained from 0.01 M to 1 M, depending upon the liquid flow rate and the vaporization conditions, i.e., pressure and temperature. The precursor solute can be a single molecule or multiple species, wherein the mixture of multiple species is used in making multi-ternary thin films. A major component of the solution is a solvent that does not hinder a normal ALD process. The solvent is chosen so that its boiling point is high enough to ensure no solvent loss in delivery but low enough to ensure total vaporization in a vaporizer. The mixture of the precursor solute in a solvent often will have a higher boiling point than the solvent alone, but the solvent has a high boiling point to prevent any premature separation of solute and solvent during delivery or at the entrance of the vaporizer. Stabilizing additives with concentrations at 0.0001 M to 1 M may be added to the solvent to help prevent premature decomposition of the ALD precursors in the vaporizer. In addition, the stabilizing additives provide similar attributes as ligand parts of a precursor and may prolong the shelf-life of the solution. The solution is delivered at room temperature by pumping at pre-selected flow rates. After the solution enters the vaporizer, both solvent and solute are vaporized to form a hot vapor stream. The hot vapor is then switched on and off by a fast action pressure swing mechanism operating at room temperature. This produces normal ALD growth without suffering particle contamination, thermal decomposition or solvent interference.

In accordance with the present invention, at a given temperature and precursor concentration, the maximum liquid flow rate or maximum vaporizer pressure can be calculated. In particular, to produce a single vapor phase solution precursor, the precursor partial pressure when all molecules are in vapor phase should not exceed the material vapor pressure at the given conditions. The selected vaporizer temperature should be below the thermal decomposition temperatures of the precursor and the volume of the vaporizer is selected based on the size of the deposition chamber or substrates being used.

Metal or non-metal precursors are selected from those known in the literature and in most cases are readily available commercially at a reasonable cost. Most of these precursors are in solid form, and therefore, are difficult to use directly because of low vapor pressures and high boiling points. In particular, if source temperature is set high to generate enough vapor pressure, the precursor may thermally decompose. In addition, direct use of solid precursors raises the risk of particle contamination or unstable dosage. The precursors according to the present invention include halides, alkoxides, β-diketonates, nitrates, alkylamides, amidinates, cyclopentadienyls, and other forms of (organic or inorganic) (metal or non-metal) compounds. Typical concentrations of precursors in a solution are from 0.01 M to 1 M, depending upon the liquid flow rate and the vaporization conditions, i.e., pressure and temperature. Examples of solutes are given in Table 4, but the present invention is not limited thereto, and any suitable solutes may be used.

TABLE 4

Examples of ALD precursor solutes

| Name | Formula | MW | Mp (° C.) | bp (° C./mmHg) | Density (g/mL) |
|---|---|---|---|---|---|
| Tetrakis(ethylmethylamino)hafnium (TEMAH) | $Hf[N(EtMe)]_4$ | 410.9 | −50 | 79/0.1 | 1.324 |
| Hafnuim (IV) Nitrate, anhydrous | $Hf(NO_3)_4$ | 426.51 | >300 | n/a | |
| Hafnuim (IV) Iodide, anhydrous | $HfI_4$ | 686.11 | 400 (subl.) | n/a | 5.6 |
| Dimethylbis(t-butylcyclopentadienyl hafnium(IV) | $[(t-Bu)Cp]_2HfMe_2$ | 450.96 | 73-76 | n/a | |
| Tetrakis(1-methoxy-2-methyl-2-propoxide)hafnium (IV) | $Hf(O_2C_5H_{11})_4$ | 591 | n/a | 135/0.01 | |
| Di(cyclopentadienyl)Hf dichloride | $Cp_2HfCl_2$ | 379.58 | 230-233 | n/a | |
| Hafnium tert-butoxide | $Hf(OC_4H_9)_4$ | 470.94 | n/a | 90/5 | |
| Hafnium ethoxide | $Hf(OC_2H_5)_4$ | 358.73 | 178-180 | 180-200/13 | |
| Aluminum i-propoxide | $Al(OC_3H_7)_3$ | 204.25 | 118.5 | 140.5/8 | 1.0346 |
| Lead t-butoxide | $Pb(OC(CH_3)_3)_2$ | 353.43 | | | |
| Zirconium (IV) t-butoxide | $Zr(OC(CH_3)_3)_4$ | 383.68 | | 90/5; 81/3 | 0.985 |
| Titanium (IV) i-propoxide | $Ti(OCH(CH_3)_2)_4$ | 284.25 | 20 | 58/1 | 0.955 |

TABLE 4-continued

Examples of ALD precursor solutes

| Name | Formula | MW | Mp (° C.) | bp (° C./mmHg) | Density (g/mL) |
|---|---|---|---|---|---|
| Barium i-propoxide | Ba(OC$_3$H$_7$)$_2$ | 255.52 | 200 (dec) | n/a | |
| Strontium i-propoxide | Sr(OC$_3$H$_7$)$_2$ | 205.8 | | | |
| Bis(pentamethylCp)Barium | Ba(C$_5$Me$_5$)$_2$ | 409.8 | | | |
| Bis(tripropylCp)Strontium | Sr(C$_5$i-Pr$_3$H$_2$)$_2$ | 472.3 | | | |
| (Trimethyl)pentamethylcyclo-pentadienyl titanium (IV) | Ti(C$_5$Me$_5$)(Me$_3$) | 228.22 | | | |
| Bis(2,2,6,6-tetramethyl-3,5-heptanedionato)barium triglyme adduct | Ba(thd)$_2$ * triglyme | 503.85 (682.08) | 88 | | |
| Bis(2,2,6,6-tetramethyl-3,5-heptanedionato)strontium triglyme adduct | Sr(thd)$_2$ * triglyme | 454.16 (632.39) | 75 | | |
| Tris(2,2,6,6-tetramethyl-3,5-heptanedionato)titanium(III) | Ti(thd)$_3$ | 597.7 | | 75/0.1 (sp) | |
| Bis(cyclpentadinyl)Ruthenium (II) | RuCp$_2$ | 231.26 | 200 | 80-85/0.01 | |

Other examples of precursor solutes include Ta(NMe$_2$)$_5$ and Ta(NMe$_2$)$_3$(NC$_9$H$_{11}$) that can be used as Tantalum film precursors.

The selection of solvents is critical to the ALD precursor solutions according to the present invention. In particular, the solvents should have reasonable solubility of ALD precursors at room temperature and should be chemically compatible with the precursors. The boiling point of the solvent should be high enough to ensure no solvent loss in delivery and low enough to ensure total vaporization in the vaporizer, although the boiling point of the solvent can be either lower or higher than the precursor solute. The solvent molecules should not compete with precursor molecules for reaction sites on the substrate surface, e.g., the solvent must not be chemically adsorbed on the surface by reacting with a surface hydroxide group. The solvent molecules or their fragments should not be any part of the ALD solid film composition. Examples of solvents useful in the present invention are given in Table 5, but are not limited thereto, as any suitable solvent meeting the above criteria may be used.

TABLE 5

Examples of solvents

| Name | Formula | BP@760Torr (° C.) |
|---|---|---|
| Dioxane | C$_4$H$_8$O$_2$ | 101 |
| Toluene | C$_7$H$_8$ | 110.6 |
| n-butyl acetate | CH$_3$CO$_2$(n-Bu) | 124-126 |
| Octane | C$_8$H$_{18}$ | 125-127 |
| Ethylcyclohexane | C$_8$H$_{16}$ | 132 |
| 2-Methoxyethyl acetate | CH$_3$CO$_2$(CH$_2$)$_2$OCH$_3$ | 145 |
| Cyclohexanone | C$_6$H$_{10}$O | 155 |
| Propylcyclohexane | C$_9$H$_{18}$ | 156 |
| 2-Methoxyethyl Ether (diglyme) | (CH$_3$OCH$_2$CH$_2$)$_2$O | 162 |
| Butylcyclohexane | C$_{10}$H$_{20}$ | 178 |

Another example of a solvent useful for the present invention is 2,5-dimethyloxytetrahydrofuran.

Stabilizing agents to prevent premature decomposition of ALD precursors in the vaporizer and to prolong the shelf-life of the ALD precursor solutions may also be added. However, the precursor in solution is normally stable at room temperature with or without the use of stabilizing additives. Once the solid precursor has been dissolved in the solvent, the liquid solutions can be delivered using a liquid metering pump, a mass flow controller, a syringe pump, a capillary tube, a step pump, a micro-step pump or other suitable equipment at room temperature. The flow rate is controlled from 10 nL/min to 10 mL/min depending upon the size of the deposition systems, i.e. the flow rate can be scaled up as necessary for larger deposition systems.

One method according to the present invention is described as follows. Precisely controlled liquid solution is injected into a vaporizer that may have internal or external heating sources or both. Optionally, the solution can be atomized using a nebulizer, e.g., pneumatic jets or an external energy source, such as inert gas co-axial flow or an ultrasonic source. The vaporizer temperature is controlled by a PID loop and the vaporizer is operated to evaporate both solvent and solute within a given pressure range. In general, the temperature is set at between 100° C. and 350° C. while the pressure is between −14 psig and +10 psig. The vaporizer temperature is optimized for specific solute concentration and delivery rate. Preferably, vaporization temperatures are from 150° C. to 250° C. and flow rates are between 0.1 μL/min and 100 μL/min. If the temperature is too low, precursor molecules may condense because of low saturation partial pressure and if the temperature is too high, the precursor molecules may decompose inside the vaporizer chamber. To ensure particle-free vapor phase formation before ALD, the hot precursor and solvent vapor may be passed through a particle filter operated at the same or a higher temperature than the vaporizer temperature.

The present invention also relates to the delivery of vaporized solution precursors. There are two preferred delivery methods for the vaporized solution precursors according to the present invention. The first preferred method comprises operating at a constant pumping speed from a vacuum chamber to the exit of the vaporizer. In this method, to achieve the total vaporization of the precursor solution, the liquid flow rate must be kept below an established upper limit. For example, a precursor solution of aluminum iso-propoxide has a vapor pressure of about 8 Torr at 140.5° C. If the vaporizer is operated at this temperature, the maximum liquid flow rates for the aluminum iso-propoxide solution at 0.1 M concentration are 48, 242 and 725 microliter/min for pumping speeds of 0.01, 0.05 and 0.15 L/min, respectively. To deliver higher liquid flow rates of a given precursor solution, the vaporizer temperature can be increased up to the thermal decomposition temperature of the precursor solute.

The second preferred method according to the present invention comprises operating at constant vaporizer pressure. Constant total pressure in the vaporizer can be controlled by pumping speed at the exit of the vaporizer and liquid flow rate at the entrance to the vaporizer. In this method, to achieve the total vaporization of the precursor solution, total vaporizer pressure must be kept below an established upper limit. For example, a precursor solution of aluminum iso-propoxide has a vapor pressure of about 8 Torr at 140.5° C. If the vaporizer is operated at this temperature, the maximum total pressure in the vaporizer for the aluminum iso-propoxide solution at 0.1 M concentration is about 500 Torr when n-Octane is the solvent. To operate at higher total vaporizer pressure for a given precursor solution, the vaporizer temperature can be increased up to the thermal decomposition temperature of the precursor solute.

To deposit the ALD layers, the hot precursor and solvent are switched on and off by a fast action pressure swing device consisting of fast switch valves and an inert gas source. The valves are operated at room temperature and are not exposed to reactive hot vapor. When valves are switched off, inert gas forms a diffusion barrier to prevent hot vapor from entering the deposition chamber. Inert gas is also sent to the deposition chamber to purge out excess precursor and solvent from the previous cycle which can be then carried to an exhaust system. When the valves are on, hot vapor and inert gas enter the deposition chamber to dose deposition on the substrate surface. The ratio of inert gas entering the chamber and going to the exhaust is adjustable by means of metering valves or mass flow controllers. Typically, precursor A is on for 0.1 to 10 seconds, followed by a purge for 1 to 10 seconds, precursor B is on for 0.1 to 10 seconds, followed by another purge for 1 to 10 seconds. In such an operation, the precursor A could be a metal precursor from the solution vaporizer, and precursor B could be a gas phase reactant such as water, oxygen, ozone, hydrogen, ammonia, silane, disilane, diborane, hydrogen sulfide, organic amines and hydrazines, or other gaseous molecular or plasma or radical sources. In another embodiment, a stop-and-go delivery method may be used instead of a continuous flow method. In addition, vaporized precursors may be stored in vessels before delivery into the deposition chamber using a control system including appropriate valves.

An ALD deposition system that can be used in the present invention is shown in FIG. 1. In particular, the system includes solution vessel 10, for holding the dissolved precursor solution (precursor A), a liquid pump 20, to pump precursor A to a vaporizer 30, a vessel 40, for holding precursor B, such as water, a deposition chamber 50, having a monitoring device 60, therein, and an exhaust system 70. Standard connections and valves may be included as is known in the art to control the method as described above. By using the system shown in FIG. 1, pulses of the vapor phase precursors from vaporizer 30 and vessel 40 are well separated in time as they enter into the deposition chamber 50. Further, certain elements, such as the inert gas source are not shown, but are standard in the industry.

The ALD system according to the present invention may be used to grow thin films and to operate as a self-limiting ALD process. In operation, a silicon wafer substrate is provided in the deposition chamber. The preferred monitoring device is an in-situ device, such as a quartz crystal microbalance (QCM) that monitors the growth of thin films in real time. For example, a QCM with starting frequency at 6 MHz installed in a tubular reactor may be used. The growth surface is a blanket electrode, typically gold that may be modified with oxides, or silicon or other metals for a better nucleation step during the initial ALD growth. The temperature of the deposition chamber is set from 100° C. to 400° C. and is precisely controlled within ±0.1° C. variation or less using a PID loop. The deposition chamber pressure is set from 0.1 to 10 Torr. For more continuous production, the ALD deposition chamber can be coupled to the source and delivery systems. The deposition chamber can be any suitable type, including, but not limited to, flow through reactors, shower head reactors, and spray/injection head reactors.

The precursors A and B are carefully separated in the exhaust system to prevent unwanted reactions. Each precursor can be trapped in a foreline trap that may operate at different temperatures. For example, a room temperature trap with stainless steel filter may be used. The separated precursors can be further separated for disposal or recycle.

Several examples of the use of solid precursors dissolved in a solvent and used in an ALD process according to the present invention are provided below.

EXAMPLE 1

$Al_2O_3$ Thin Film

Figure 2:
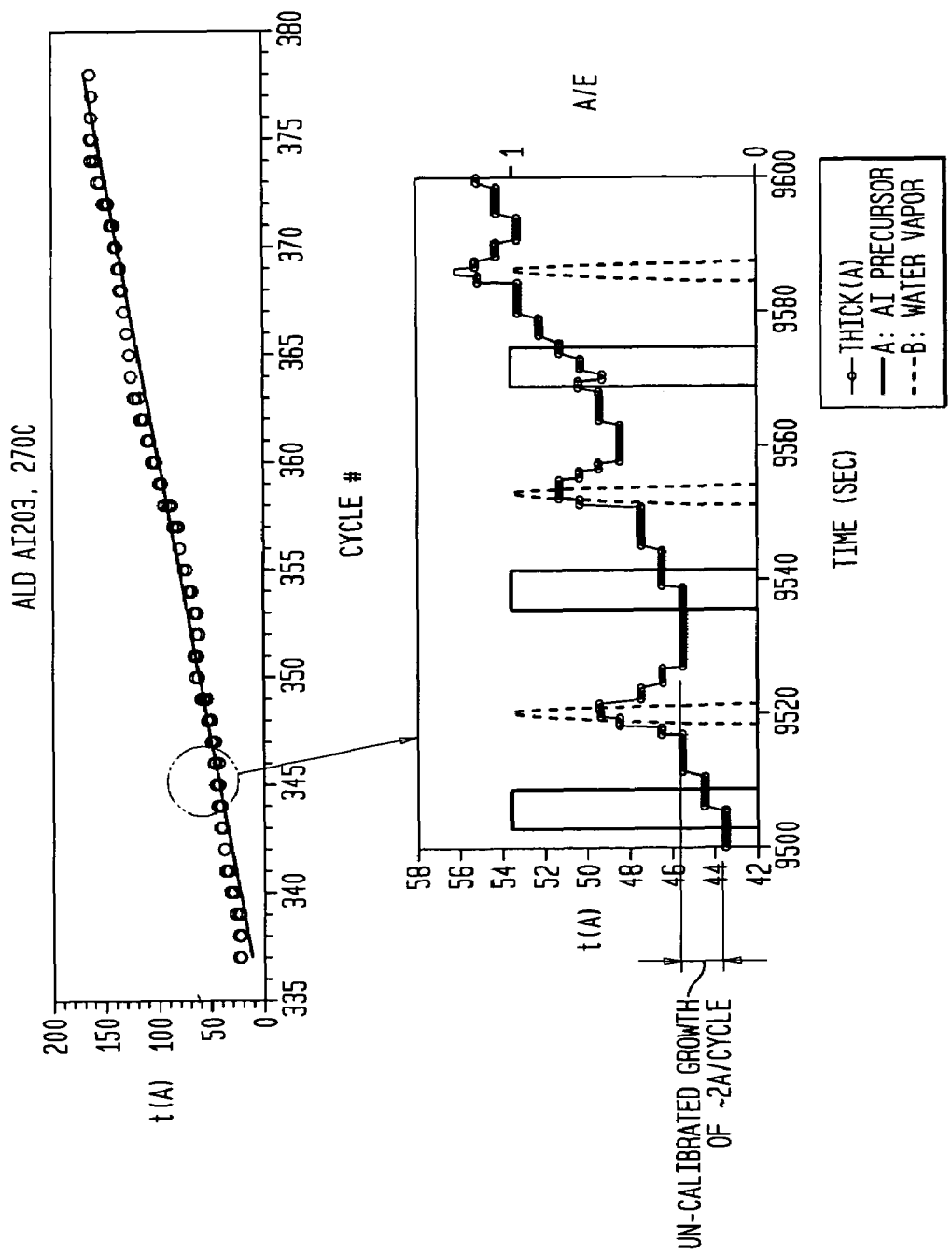
FIG. 2 is a graph plotting ALD growth of $Al_2O_3$ in cycle and time domains according to the present invention.

Solid aluminum i-propoxide is dissolved in ethylcyclohexane or other solvents as listed in Table 5. A stabilizing agent, such as oxygen containing organic compounds such as THF, 1,4-dioxane, and DMF can be added. The concentration of the aluminum precursor is between 0.1 M and 0.2 M. Liquid flow rate is controlled from 10 nL/min to 10 µL/min. Water is used as a gas phase reactant. The temperatures of vaporizer and deposition chamber are set at 150° C.-300° C. and 250° C.-400° C., respectively. Typical pulse times for the Al-solution, purge, water, and purge steps are 0.1-10, 1-10, 0.1-10, and 1-10 seconds, respectively. The upper portion of FIG. 2 shows linear growth of the ALD $Al_2O_3$ as a function of cycle number, wherein the Y axis is film thickness in units. The bottom portion of FIG. 2 shows three growth cycles expanded in time domain, where digitized Al solution pulse (A) and water vapor pulse (B) are plotted together with film thickness t( ).

EXAMPLE 2

$HfO_2$ Thin Film

Figure 3:
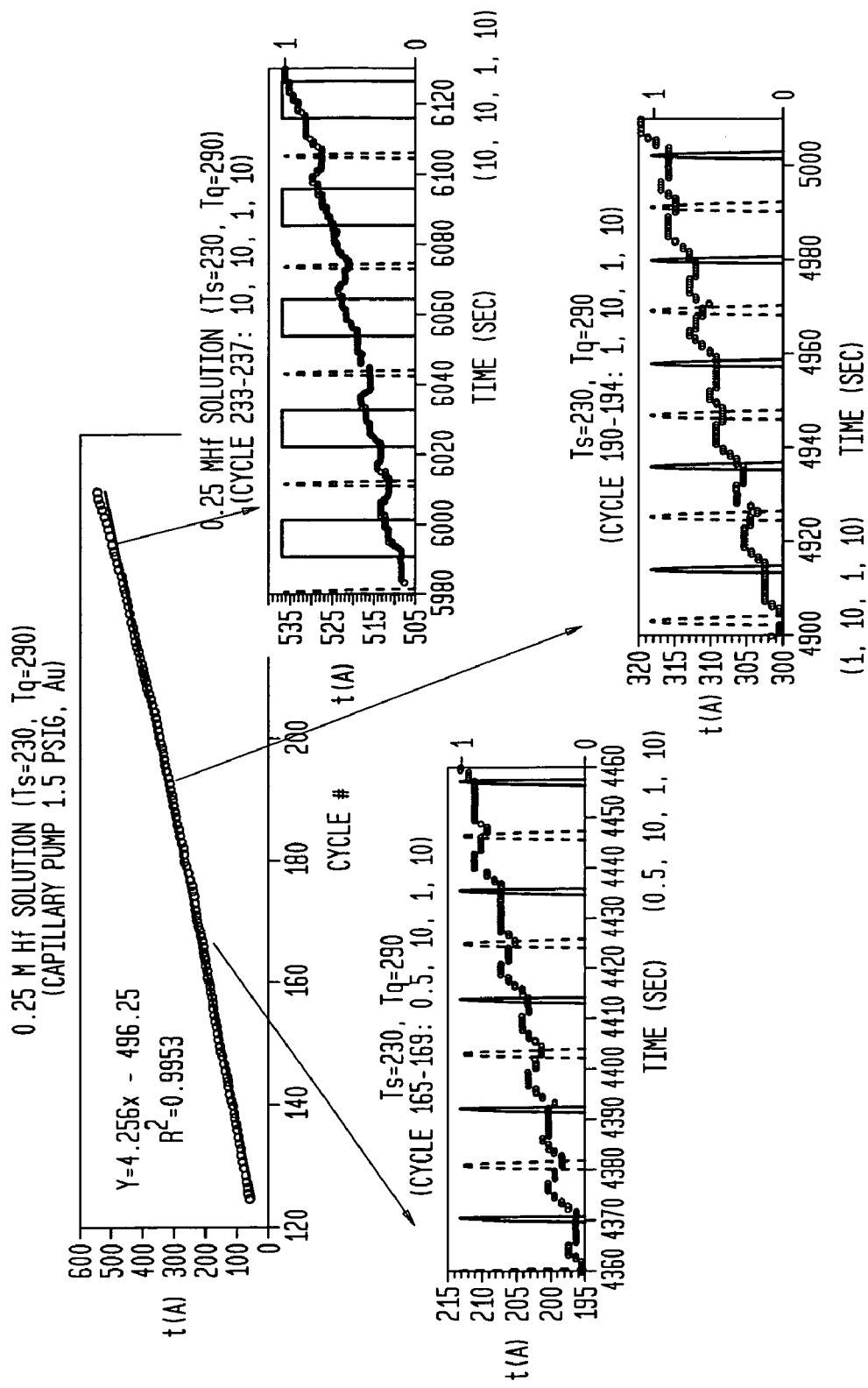
FIG. 3 is a graph plotting ALD growth of $HfO_2$ in cycle and time domains at three different precursor dosages according to the present invention.
Figure 4:
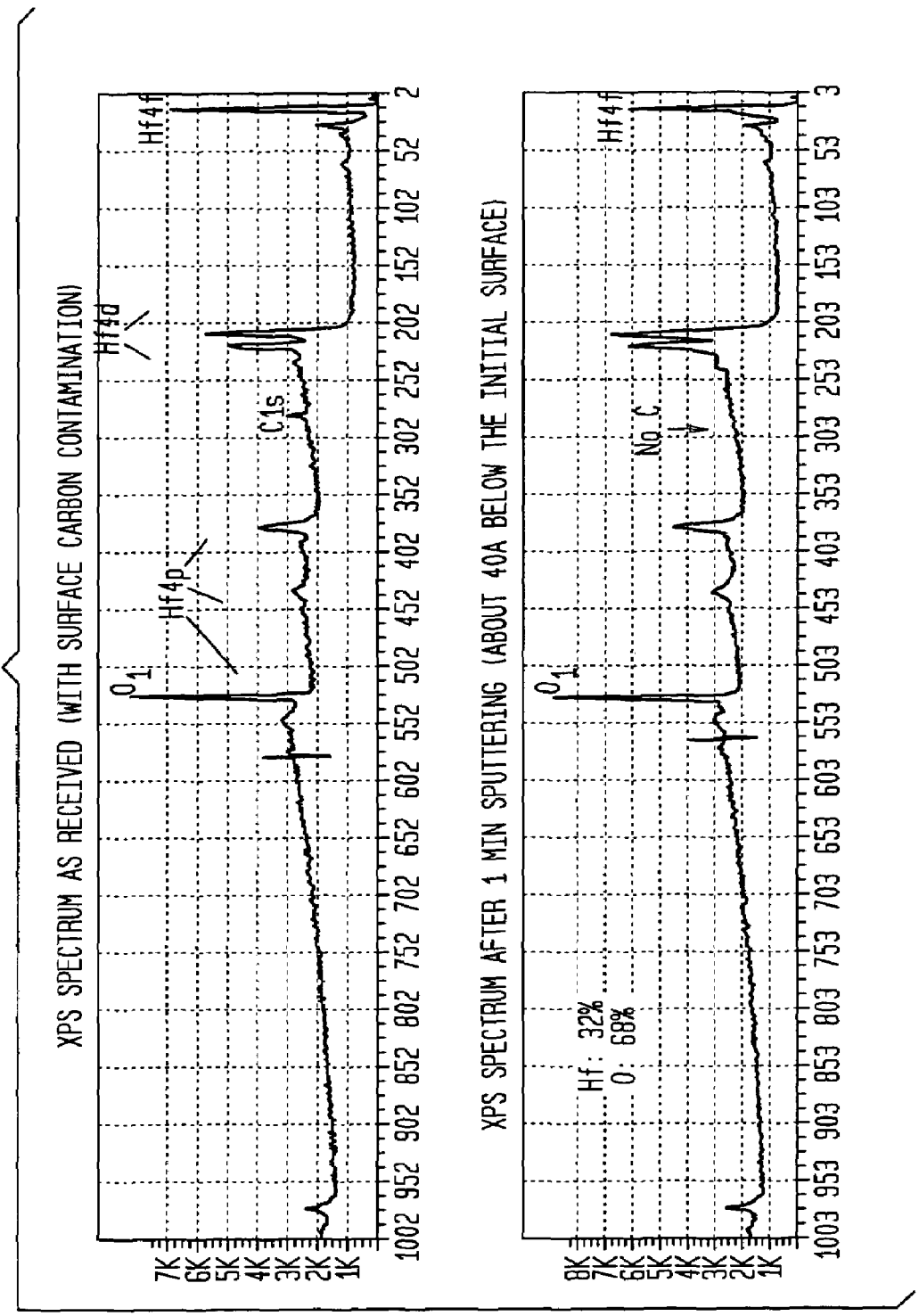
FIG. 4 is an XPS spectrum of surface and thin film composition of an ALD grown $HfO_2$ sample according to the present invention.

Solid $[(t-Bu)Cp]_2HfMe_2$ is dissolved in ethylcyclohexane or other solvents as listed in Table 5. A stabilizing agent, such as oxygen containing organic compounds such as THF, 1,4-dioxane, DMF, Cp and the like can be added. The Hf precursor concentration is set at from 0.1 M to 0.2 M. Liquid flow rate is controlled at from 10 nL/min to 10 µL/min. Water is used as a gas phase reactant. The temperatures of vaporizer and deposition chamber are set at 200° C.-300° C. and 200° C.-400° C., respectively. Typical pulse times for the Hf-solution, purge, water, and purge steps are 0.1-10, 1-10, 0.1-10, and 1-10 seconds, respectively. The upper portion of FIG. 3 shows linear growth of ALD $HfO_2$ as a function of cycle number, where the Y axis is film thickness in units. The three highlighted graphs show different Hf solution pulse times of 0.5, 1 and 10 seconds respectively, with water vapor pulse and $N_2$ purge times fixed at 1 and 10 seconds. FIG. 4 shows an $HfO_2$ film composition using XPS analysis wherein the top portion is surface XPS with environmental carbon contamination and the bottom portion is ALD film composition after 1 minute sputtering. The results indicate there is no impurity incorporation when using the present invention.

EXAMPLE 3

Self-limited HfO$_2$ Thin Film

Figure 5:
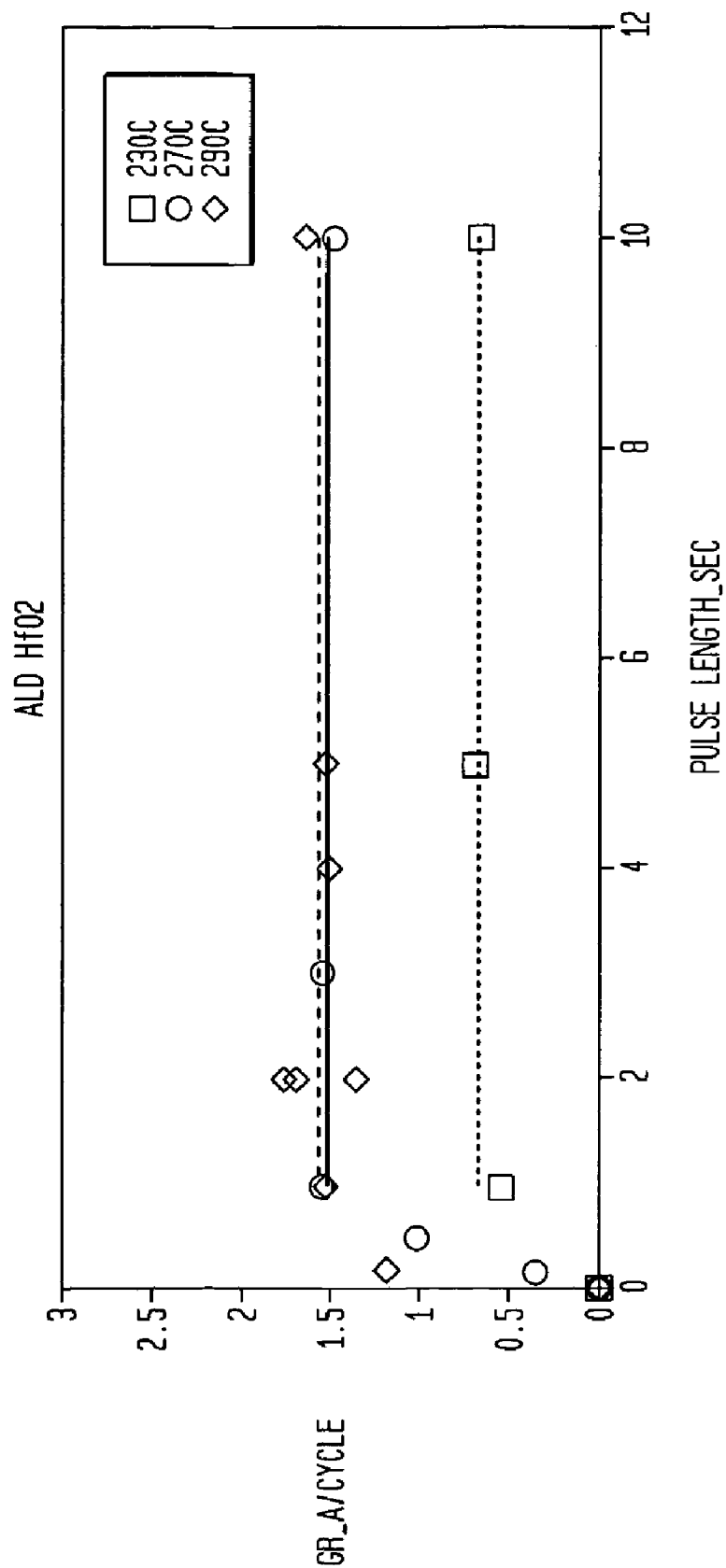
FIG. 5 is a graph plotting ALD growth of $HfO_2$ at different temperatures and pulse lengths according to the present invention.

Self-limited ALD growth is demonstrated in FIG. 5 for each of three different temperature settings where metal precursor pulse length is increased from 0 to 1 seconds to oversaturate the deposition surface. The X-axis is Hf precursor pulse length in seconds and the Y-axis is film QCM growth rate in Angstroms per cycle. As shown, growth rates are independent of precursor dosage after saturation and confirm true ALD deposition. Water vapor pulse length was fixed at 1 second during the test. In this example, 0.2 M[(t-Bu)Cp]$_2$HfMe$_2$ is dissolved in Octane. The XPS data shows the O/Hf ratio to be 2 and carbon impurity below the detection limit of 0.1%.

EXAMPLE 3

HfO$_2$ Thin Film

Figure 6:
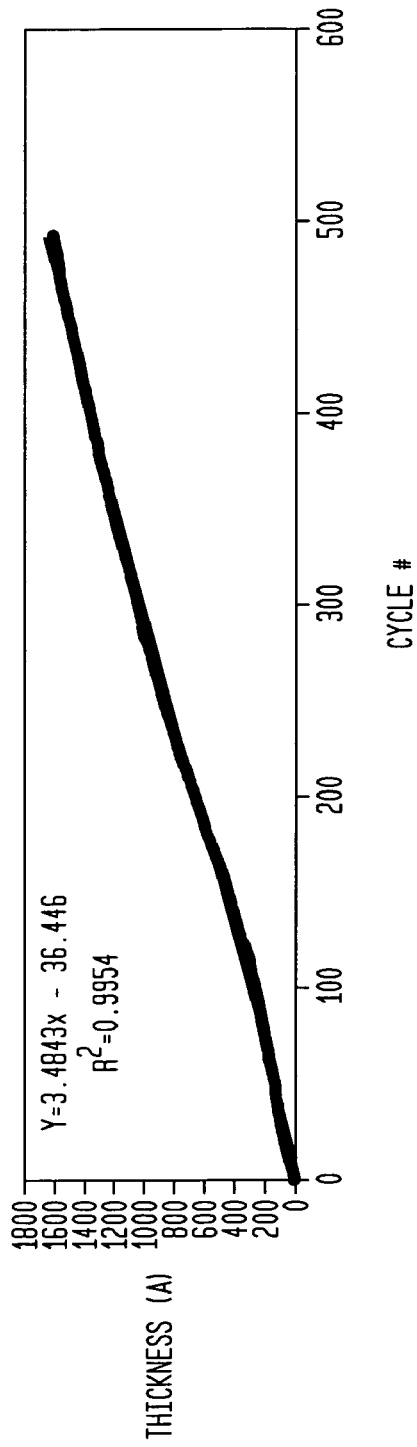
FIG. 6 is a graph plotting ALD growth of $HfO_2$ according to the present invention.
Figure 7:
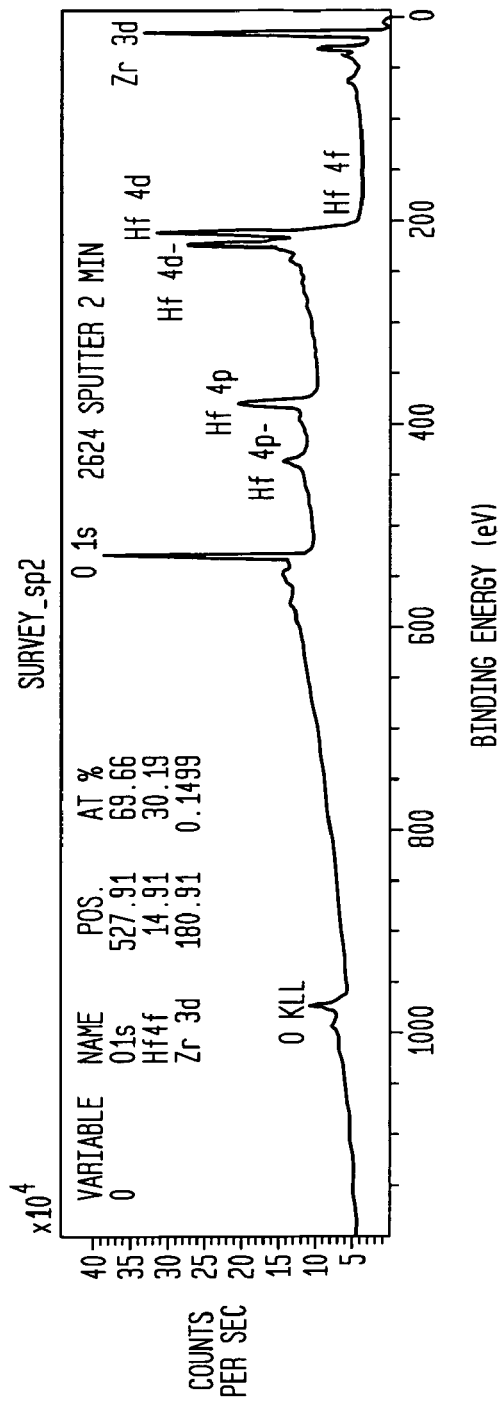
FIG. 7 is an XPS spectrum of thin film composition of an ALD grown $HfO_2$ sample according to the present invention.

Solid Tetrakis(1-methoxy-2-methyl-2-propoxide)hafnium (IV), Hf(mmp)$_4$ is dissolved in ethylcyclohexane or other solvents as listed in Table 5. A stabilizing agent, such as oxygen containing organic compounds such as THF, 1,4-dioxane, DMF, Cp and the like can be added. The Hf precursor concentration is set at 0.1 M to 0.2 M. Liquid flow rate is controlled from 10 nL/min to 10 µL/min. Water is used as a gas phase reactant. The temperatures of vaporizer and deposition chamber are set at 150° C.-300° C. and 200° C.-350° C., respectively. Typical pulse times for the Hf-solution, purge, water, and purge steps are 0.1-10, 1-10, 0.1-10, and 1-10 seconds, respectively. FIG. 6 shows linear growth of ALD HfO$_2$ as a function of cycle number, where the Y axis is film thickness in Angstroms. FIG. 7 shows the HfO$_2$ film composition as formed in this Example, using XPS analysis after two minutes sputtering to remove surface contamination. The results indicate there is no impurity incorporation when using the present invention. The XPS data shows the O/Hf ratio to be 2.3 and carbon impurity below the detection limit of 0.1%.

EXAMPLE 4

BST Thin Films

Figure 8:
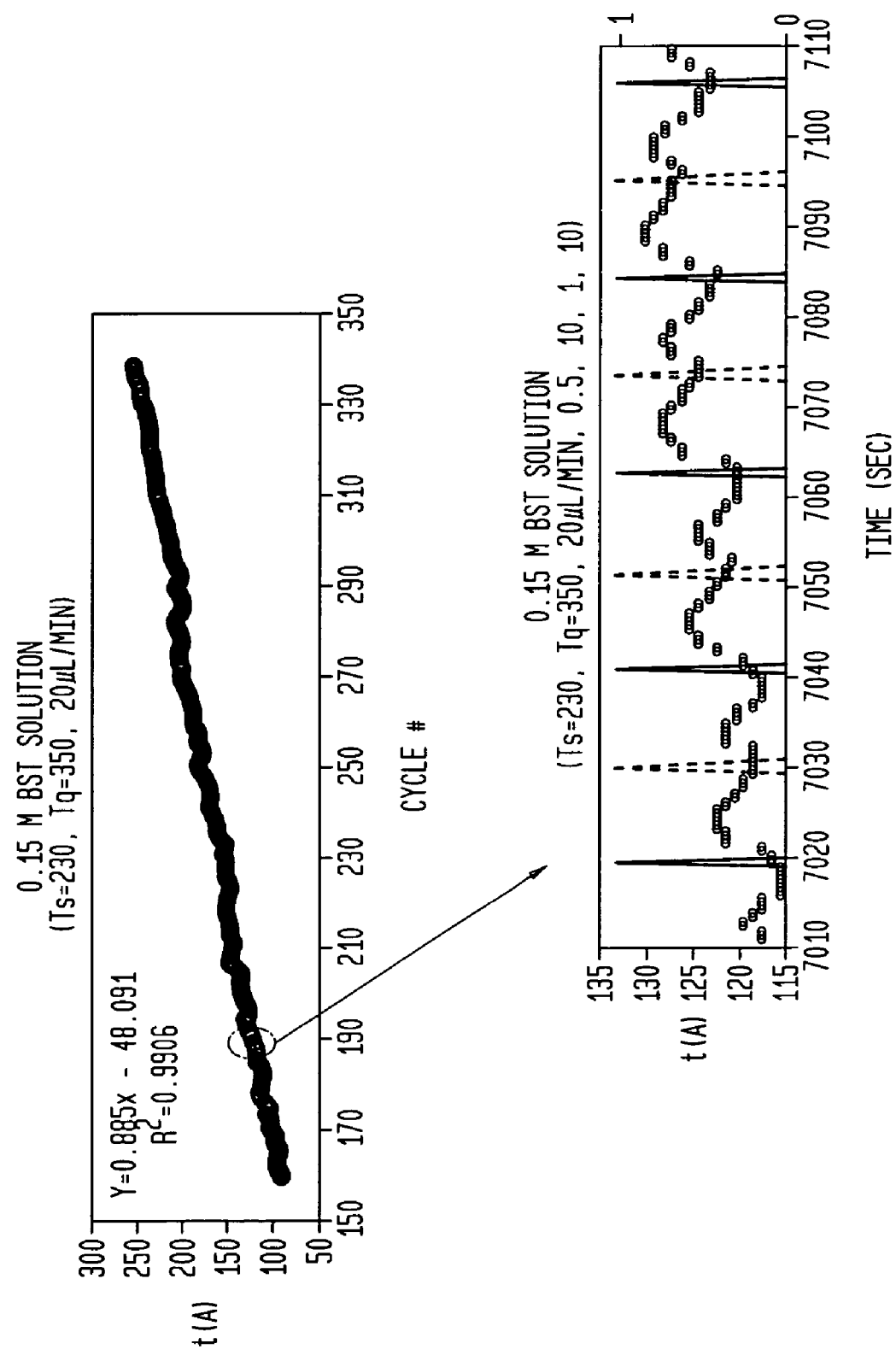
FIG. 8 is a graph plotting ALD growth of BST in cycle and time domains according to the present invention.

Solids of Ba(O-iPr)$_2$, Sr(O-iPr)$_2$, and Ti(O-iPr)$_4$ are dissolved in ethylcyclohexane or other solvents as listed in Table 5 with different mixing ratios. Stabilizing agents such as oxygen containing organic compounds such as THF, 1,4-dioxane, and DMF can be added. The BST precursor concentration is set at 0.1 M to 0.2 M for each component. Liquid flow rate is controlled from 10 nL/min to 10 µL/min. Water is used as a gas phase reactant. The temperatures of vaporizer and deposition chamber are set at 200° C.-350° C. and 300° C.-400° C., respectively. Typical pulse times for the mix-solution, purge, water, and purge steps are 0.1-10, 1-10, 0.1-10 and 1-10 seconds, respectively. The upper portion of FIG. 8 shows linear growth of ALD BST as a function of cycle number, where the Y axis is film thickness in units. The bottom portion of FIG. 8 shows four and a half growth cycles expanded in time domain with digitized BST solution pulse and water vapor pulse plotted together with film thickness t( ).

EXAMPLE 5

Ru Thin Film

Figure 9:
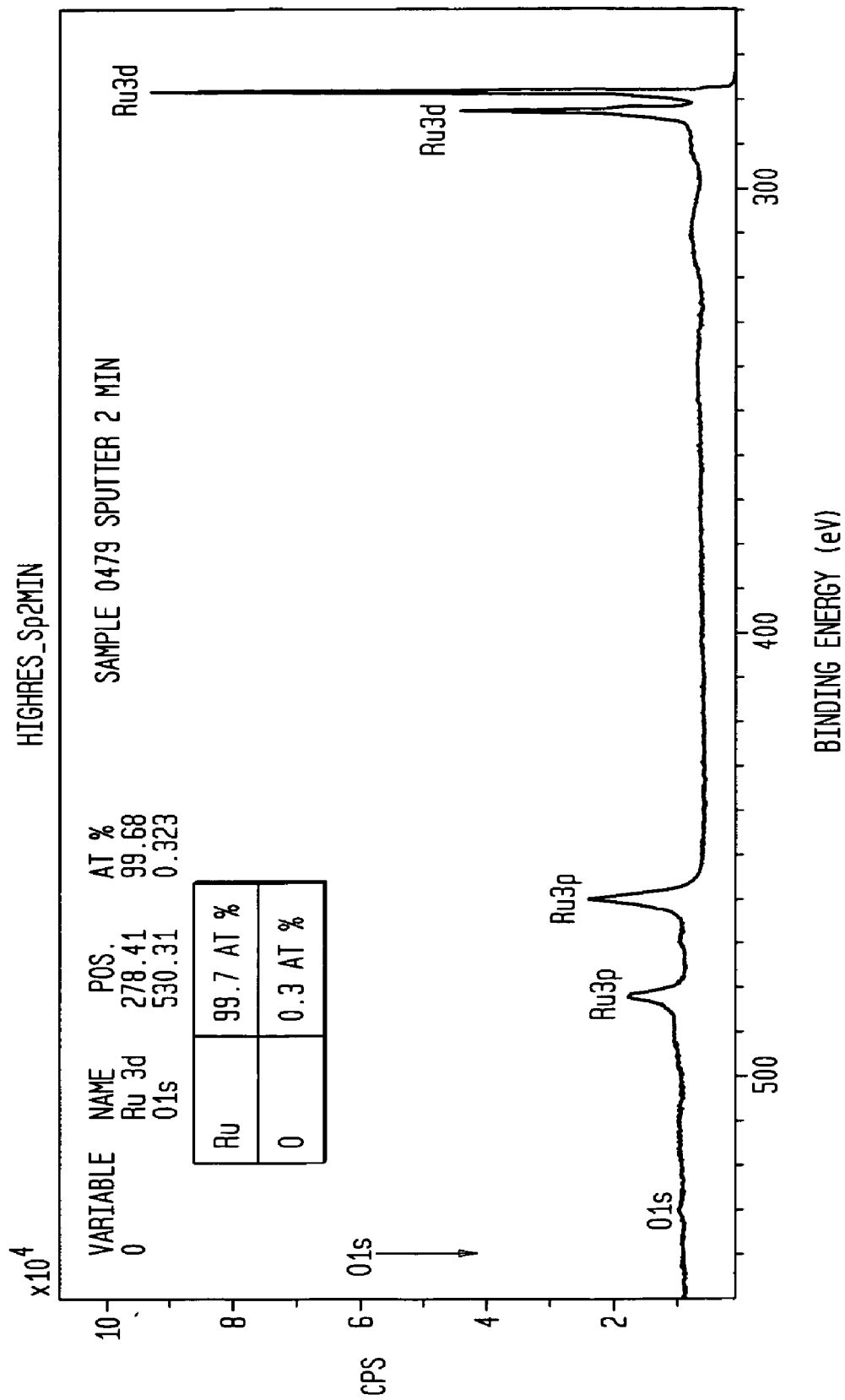
FIG. 9 is an XPS spectrum of thin film composition of an ALD grown Ru sample according to the present invention.

Solid RuCp$_2$ is dissolved in dioxane, dioxane/octane or 2,5-dimethyloxytetrahydrofuran/octane. The concentration of Ru precursor is set at 0.05 M to 0.2 M. A stabilizing agents such as Cp and the like can be added. Liquid flow rate is controlled from 10 nL/min to 10 µL/min. Oxygen gas is used as a combustion agent. The temperatures of vaporizer and deposition chamber are set at 140° C.-300° C. and 300° C.-400° C., respectively. Typical pulse times for the Ru-solution, purge, oxygen, and purge steps are 0.1-10, 1-10, 0.1-10, and 1-10 seconds, respectively. FIG. 9 shows Ru film composition using XPS analysis after 1.5 minutes sputtering to remove surface contamination. The results indicate there is no impurity incorporation when using the present invention. The film resistivity is about 12 micro-Ohm*cm by 4-point probe measurement.

It is anticipated that other embodiments and variations of the present invention will become readily apparent to the skilled artisan in the light of the foregoing description, and it is intended that such embodiments and variations likewise be included within the scope of the invention as set out in the appended claims.

What is claimed:
1. A method of atomic layer deposition comprising:
   alternately delivering a vaporized precursor solution and a vaporized reaction solution to a deposition chamber;
   forming a monolayer of components of the precursor solution and reaction solution on surface of a substrate in the deposition chamber; and
   repeating until a thin film of a predetermined thickness is formed;
   wherein the vaporized precursor solution comprises [(t-Bu)Cp]$_2$HfMe$_2$ dissolved in ethylcyclohexane or octane and wherein the thin film is HfO$_2$; and
   wherein the precursor solution is delivered to a vaporizer at room temperature and vaporized without decomposition or condensation.

* * * * *